United States Patent
Benane

(10) Patent No.: US 11,370,322 B2
(45) Date of Patent: Jun. 28, 2022

(54) METHOD AND SYSTEM FOR DETERMINING THE STATE OF HEALTH OF A BATTERY OF A MOTORIZED LAND VEHICLE

(71) Applicant: PSA AUTOMOBILES SA, Poissy (FR)

(72) Inventor: Said Benane, L Hay les Roses (FR)

(73) Assignee: PSA AUTOMOBILES SA, Poissy (FR)

( * ) Notice: Subject to any disclaimer, the term of this patent is extended or adjusted under 35 U.S.C. 154(b) by 0 days.

(21) Appl. No.: 17/422,419

(22) PCT Filed: Jan. 31, 2020

(86) PCT No.: PCT/FR2020/050165
§ 371 (c)(1),
(2) Date: Jul. 12, 2021

(87) PCT Pub. No.: WO2020/174139
PCT Pub. Date: Sep. 3, 2020

(65) Prior Publication Data
US 2022/0041079 A1    Feb. 10, 2022

(30) Foreign Application Priority Data
Feb. 26, 2019   (FR) ........................ 1901982

(51) Int. Cl.
*B60L 58/16* (2019.01)
*G01R 31/392* (2019.01)
(Continued)

(52) U.S. Cl.
CPC .............. *B60L 58/16* (2019.02); *B60L 58/12* (2019.02); *B60L 58/18* (2019.02); *G01R 31/007* (2013.01);
(Continued)

(58) Field of Classification Search
CPC .. B60L 3/00; B60L 3/0046; B60L 3/12; B60L 2240/545; B60L 2240/547; B60L 2240/549; B60L 7/10; B60L 58/18; B60L 58/16; B60L 58/12; H01M 2220/20; H01M 10/482; H01M 10/486; H01M 10/48; G01R 31/392; G01R 31/367; G01R 31/396; G01R 31/007; G01R 31/00
(Continued)

(56) References Cited

U.S. PATENT DOCUMENTS

2019/0107406 A1 *   4/2019  Cox ................... G01C 21/3679

FOREIGN PATENT DOCUMENTS

| WO | 2013167833 A1 | 11/2013 |
| WO | 2015132544 A1 | 9/2015 |

OTHER PUBLICATIONS

International Search Report for PCT/FR2020/050165 dated May 20, 2020.
Written Opinion for PCT/FR2020/050165 dated May 20, 2020.

* cited by examiner

*Primary Examiner* — Anthony R Jimenez
(74) *Attorney, Agent, or Firm* — Sandberg Phoenix & von Gontard PC

(57) ABSTRACT

The invention relates to a method for determining a value of a parameter which characterizes the state of health of a battery made up of a plurality of cells and installed on-board a motorized land vehicle, as well as to an associated computer determination system (100).

8 Claims, 2 Drawing Sheets

(51) Int. Cl.
  *G01R 31/396*  (2019.01)
  *B60L 58/18*  (2019.01)
  *B60L 58/12*  (2019.01)
  *G01R 31/00*  (2006.01)
  *H01M 10/48*  (2006.01)
  *B60L 7/10*  (2006.01)

(52) U.S. Cl.
  CPC ......... *G01R 31/392* (2019.01); *G01R 31/396* (2019.01); *H01M 10/482* (2013.01); *H01M 10/486* (2013.01); *B60L 7/10* (2013.01); *B60L 2240/545* (2013.01); *B60L 2240/547* (2013.01); *B60L 2240/549* (2013.01); *H01M 2220/20* (2013.01)

(58) Field of Classification Search
  USPC ....................................................... 701/32.1
  See application file for complete search history.

METHOD AND SYSTEM FOR DETERMINING THE STATE OF HEALTH OF A BATTERY OF A MOTORIZED LAND VEHICLE

CROSS-REFERENCE TO RELATED APPLICATIONS

This application is the US National Stage under 35 USC § 371 of International Application No. PCT/FR2020/050165, filed 31 Jan. 2020 which claims priority to French Application No. 1901982 filed 26 Feb. 2019, both of which are incorporated herein by reference.

BACKGROUND

The present invention relates to the field of systems for the maintenance of batteries installed on-board motorized land vehicles. The invention relates in particular to a method for determining a value of a parameter which characterizes (is indicative of) the state of health of a battery made up of a plurality of cells and installed on-board a motorized land vehicle. The invention also relates to a system implementing such a method. The invention applies in particular to motor vehicles.

Currently, the maintenance of electric vehicles is mainly based on checking the electric powertrain. To do this, it is necessary to immobilize the vehicle for an average period of 48 hours in order to perform a complete discharge, and then a full charge, of the battery. Consequently, the process of verifying the correct operation of an electric vehicle battery remains very restrictive for the user insofar as it involves unavailability of the vehicle for a relatively long period of time. This is regrettable insofar as these constraints can dissuade potential future purchasers of electric vehicles and thus limit the diffusion of electric vehicles within the global automobile fleet, when it is well known that these vehicles are the least polluting.

SUMMARY OF THE INVENTION

Disclosed is a method and a system for overcoming these drawbacks. In particular the method and system make it possible to check the correct operation of a battery installed on-board a motorized land vehicle without requiring the immobilization of the vehicle. More specifically, the method and system make it possible to remotely determine the state of health of a battery installed on-board a motorized land vehicle.

The method determines a value of a battery health parameter which characterizes (is indicative of) the state of health of a battery which is made up of a plurality of cells and installed on-board a motorized land vehicle, the method comprising the steps of:
receiving processing data generated by a computer of the vehicle and transmitted by means of a radiofrequency signal communication device arranged in the vehicle, said processing data including battery charge data indicative of a state of charge of the battery, cell voltage data indicative of at least one voltage measurement for each of the cells, cell current data indicative of at least one current measurement for each of the cells, cell temperature data indicative of at least one temperature measurement for each of the cells and journey data comprising data indicative of selected parameters of a journey made by the vehicle,
determining, for each of the cells, a value of a cell health parameter indicative of the state of health of the cell by using the cell voltage data, the cell current data and the cell temperature data,
determining at least one value of a battery use parameter indicative of a use of the battery by using the battery charge data and the journey data, and
determining the value of the battery health parameter by using the values of the cell health parameters and the value the battery use parameter.

According to one variant, the journey data can include consumption data indicative of at least one consumption value resulting from said journey.

According to another variant, the journey data can include charge data indicative of at least one charge value stored during a deceleration phase and/or during braking occurring during said journey.

According to another variant, the journey data can include location data generated using a vehicle geolocation device.

Also disclosed is a computer system for determining the value of the battery health parameter and installed on-board a motorized land vehicle, the system comprising means implementing the method as defined above.

According to one variant, the system can comprise at least one processor and one data storage medium in which at least one program is stored for executing steps according to the method implemented by the system.

Also disclosed is a computer program comprising instructions for executing the steps of a method as defined above.

Lastly, a medium is disclosed which can be used in a computer on which a program as defined above is recorded.

BRIEF DESCRIPTION OF THE FIGURES

Other features and advantages of the invention will become apparent on examination of the detailed description that follows and from the drawings, in which.

DETAILED DESCRIPTION OF THE INVENTION

Figure 1:
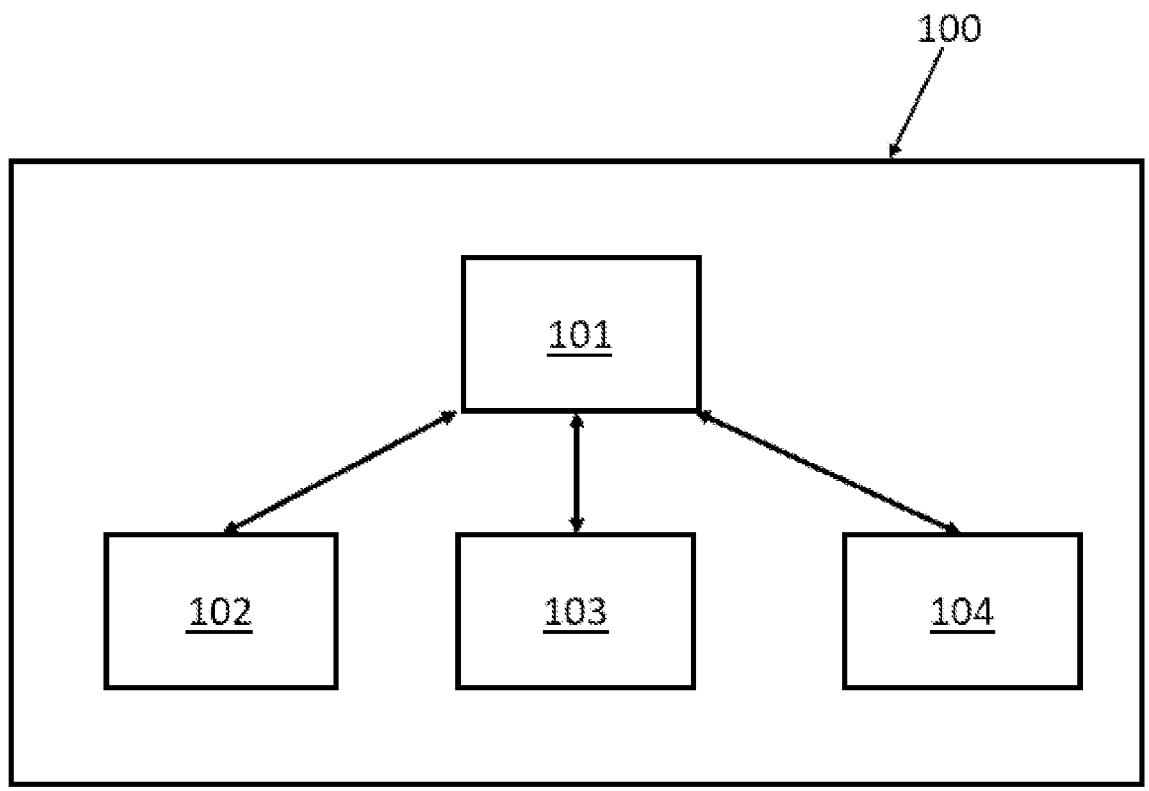
FIG. 1 is a block diagram of a system.

A computer system 100 for determining a value of a battery health parameter which is indicative of the state of health of a battery made up of a plurality of cells and installed on-board a motorized land vehicle is illustrated in FIG. 1. The computer system 100 comprises an information processing unit 101, comprising one or more processors, a data storage medium 102 and at least one input and output interface 103. Furthermore, the computer system 100 comprises an interface 104 with a private or public communications network, for example the Internet, in order to send and receive data. According to certain embodiments of the system, the computer system 100 comprises one or more computers, one or more servers, one or more supercomputers and/or any combination comprising one of these computer systems.

All the elements described above contribute to allowing the system 100 to implement the method for determining a value of the battery health parameter as described below.

Figure 2:
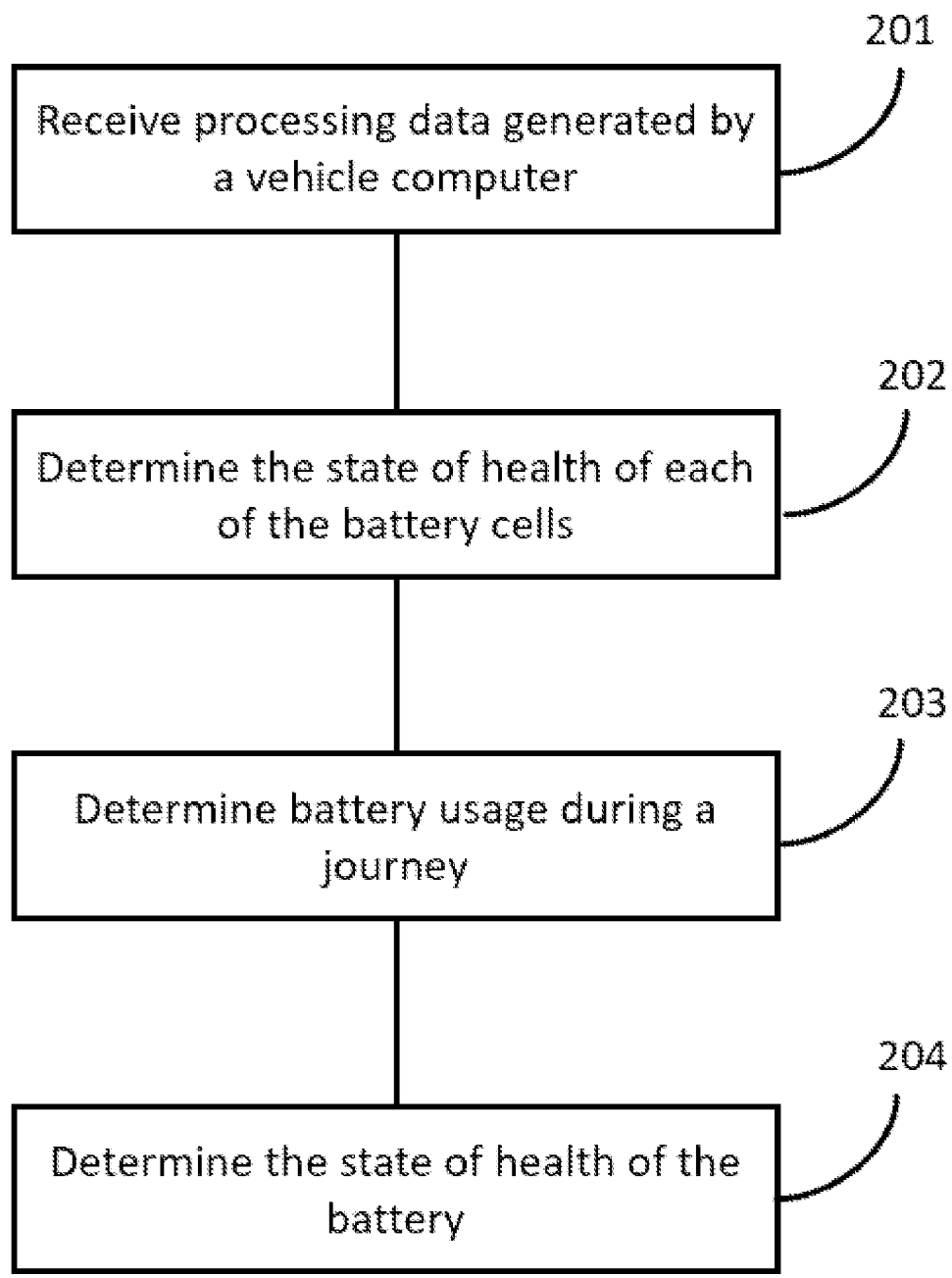
FIG. 2 is a flowchart illustrating certain steps of a method for determining a battery health parameter which is indicative of the state of health of a battery of a motorized land vehicle.

As illustrated in FIG. 2, according to a step 201, the computer system 100 receives processing data generated by a computer of the vehicle and transmitted by means of a radiofrequency signal communication device arranged in the vehicle. Advantageously, these processing data include battery charge data indicative of a state of charge of the battery ($B_{sc}$), cell voltage data indicative of at least one voltage measurement for each of the cells ($C_v$), cell current data indicative of at least one current measurement for each of the cells ($C_m$), cell temperature data indicative of at least one temperature measurement for each of the cells ($C_t$), and journey data (J) comprising data indicative of selected parameters of a journey made by the vehicle.

Preferably, the battery charge data ($B_{sc}$), the cell voltage data ($C_v$), the cell current data ($C_m$), and the cell temperature data ($C_t$) are generated by the vehicle's computer based on electrical signals emitted by sensors arranged in the vehicle and able to perform voltage, current and temperature measurements for each of the cells of the battery of the vehicle. Moreover, the journey data (J) can include location data generated by the computer by interacting with a geolocation device arranged in the vehicle, comprising a receiver interacting with a satellite positioning system. Advantageously, in addition to location data indicative of geographic coordinates related to the journey, the journey data (J) include consumption data indicative of at least one consumption value resulting from said journey. Alternatively or cumulatively, the journey data (J) include charge data indicative of at least one charge value stored during a deceleration phase and/or during braking having occurred during the journey.

Then, according to another step 202, using at least the information processing unit 101 and the data storage medium 102, the computer system 100 determines, for each of the cells, a value of a cell health parameter indicative of the state of health of the cell ($P_{CellHealth}$). To do this, the computer determination system 100 uses the cell voltage data ($C_v$), the cell current data ($C_m$) and the cell temperature data ($C_t$). That is, $P_{CellHealth} = f(C_v, C_m, C_t)$.

Then, according to another step 203, using at least the information processing unit 101 and the data storage medium 102, the computer determination system 100 determines at least one value of a battery use parameter indicative of a use of the battery during the journey made by the vehicle ($P_{Batt-use}$). To do this, the computer determination system 100 uses the battery charge data ($B_{cs}$) and the journey data (J), in particular the consumption data and the charge data. That is, $P_{Batt-use} = f(B_{cs}, J)$.

Finally, according to a final step 204, using at least the information processing unit 101 and the data storage medium 102, the computer determination system 100 determines the value of the battery health parameter ($P_{Batt-Health}$) by using the values of the cell health parameters ($P_{Cell-Health}$) and the value of the battery use parameter ($P_{Batt-use}$). That is, $P_{Batt-Health} = f(P_{Cell-Health}, P_{Batt-use})$.

Consequently, under the terms of the method and of the system described above, functional software-based components are provided to make it possible to check the correct operation of a battery installed on-board a motorized land vehicle without requiring immobilization of the vehicle. In addition, through the specific choice of processing parameters explained above, the method and the system make it possible to more precisely determine the state of health of a battery installed on-board a motorized land vehicle.

The invention is not limited to the embodiments described above, presented solely by way of examples, but extends to other embodiments, in particular those formed by combining certain features described in connection with certain embodiments with other features described in connection with other embodiments which are within the reach of those skilled in the art.

The invention claimed is:

1. A method for determining, by a computer system (100), a value of a battery health parameter which is indicative of the state of health of a battery made up of a plurality of cells and installed on-board a motorized land vehicle, the method comprises the steps of:
   receiving processing data generated by a computer of the vehicle and transmitted by means of a radiofrequency signal communication device arranged in the vehicle, said processing data including battery charge data indicative of a state of charge of the battery, cell voltage data indicative of at least one voltage measurement for each of the cells, cell current data indicative of at least one current measurement for each of the cells, cell temperature data indicative of at least one temperature measurement for each of the cells, and journey data, said journey data comprising data indicative of selected parameters of a journey made by the vehicle,
   determining, for each of the cells, a value of a cell health parameter indicative of a state of health of the cell using the cell voltage data, the cell current data and the cell temperature data,
   determining at least one value of a battery use parameter indicative of a use of the battery using the battery charge data and the journey data, and
   determining the value of the battery health parameter using the values of the cell health parameters and the value of the battery use parameter.

2. The method according to claim 1, wherein the journey data include consumption data indicative of at least one consumption value resulting from said journey.

3. The method according to claim 1, wherein the journey data include charge data indicative of at least one charge value stored during a deceleration phase and/or during braking occurring during said journey.

4. The method according to claim 1, wherein the journey data are generated using a vehicle geolocation device.

5. A computer system for determining a value of a battery health parameter indicative of the state of health of a battery made up of a plurality of cells and installed on-board a motorized land vehicle, wherein the computer system is adapted to implement the method according to claim 1.

6. The computer system according to claim 5, wherein the system comprises at least one processor and one data storage medium in which at least one computer program is stored for executing steps according to the method implemented by the system.

7. A computer program comprising program code instructions for executing the steps of a method according to claim 1 when said program is executed on a computer.

8. A computer readable medium usable in a computer and on which a program according to claim 7 is recorded.

* * * * *